United States Patent [19]

Brannon

[11] Patent Number: 5,398,144
[45] Date of Patent: Mar. 14, 1995

[54] BIAS GENERATOR FOR A LOW VOLTAGE DIFFERENTIAL READ AMPLIFIER

[75] Inventor: Craig M. Brannon, St. Louis Park, Minn.

[73] Assignee: VTC Inc., Bloomington, Minn.

[21] Appl. No.: 22,558

[22] Filed: Feb. 25, 1993

[51] Int. Cl.$^6$ .................... G11B 15/12; G11B 15/14
[52] U.S. Cl. ............................. 360/67; 350/61
[58] Field of Search .............. 360/46, 67, 68, 62, 360/66, 61; 330/133, 134, 261

[56] References Cited

U.S. PATENT DOCUMENTS

| | | | |
|---|---|---|---|
| 4,245,265 | 1/1981 | Kogue et al. | 360/66 |
| 4,326,224 | 4/1982 | Kogue et al. | 360/65 |
| 4,342,006 | 7/1982 | Ishigaki | 330/259 |
| 4,405,953 | 9/1983 | Inomata et al. | 360/65 |
| 4,477,846 | 10/1984 | Cottrell et al. | 360/46 |
| 4,480,275 | 10/1984 | Fawkes | 360/46 |
| 4,551,772 | 11/1985 | Sliger | 360/46 |
| 4,656,533 | 4/1987 | Sakai et al. | 360/65 |
| 4,706,138 | 11/1987 | Jove et al. | 360/67 |
| 4,786,993 | 11/1988 | Jove et al. | 360/67 |
| 4,879,610 | 11/1989 | Jove et al. | 360/67 |
| 4,914,533 | 4/1990 | Meunier | 360/67 |
| 5,032,935 | 7/1991 | Jove et al. | 360/67 |
| 5,057,948 | 10/1981 | Lutzeler | 360/66 |
| 5,067,032 | 11/1991 | Ida | 360/46 |
| 5,068,753 | 11/1991 | Kanegae | 360/46 |
| 5,087,884 | 2/1992 | Brannon | 324/523 |
| 5,132,852 | 7/1992 | Price, Jr. | 360/46 X |
| 5,204,789 | 4/1993 | Jove et al. | 360/67 |
| 5,206,605 | 4/1993 | Brannon et al. | 330/252 |
| 5,257,146 | 10/1993 | Price, Jr. et al. | 360/67 |

*Primary Examiner*—John Shepperd
*Assistant Examiner*—Thien Minh Le
*Attorney, Agent, or Firm*—Kinney & Lange

[57] ABSTRACT

The present invention is a read amplifier that is configured for interconnection with a magnetic head through head contacts. The read amplifier includes a differential transistor pair that is connected in a common emitter configuration. The bases of the differential transistor pair are connected across the magnetic head. A bias generator provides a bias current to the bases of the differential pair of transistors through first and second input resistors. The bias generator includes a circuit for providing a compensation voltage to the bases of the differential transistor pair that is based on changes in the bias current supplied to the differential transistor pair.

26 Claims, 1 Drawing Sheet

BIAS GENERATOR FOR A LOW VOLTAGE DIFFERENTIAL READ AMPLIFIER

BACKGROUND OF THE INVENTION

The present invention relates to read circuitry of a magnetic storage system. In particular, the present invention relates to a bias generator for providing a bias current to a differential transistor pair that forms the read amplifier.

Magnetic storage systems store information by magnetizing adjacent bit positions on a recording surface of magnetic media, such as a magnetic disc in a magnetic disc drive. Within the magnetic disc drive, an actuator arm supports a magnetic head close to the disc surface for reading and writing information to the disc surface. In larger storage systems, disc drives include several discs stacked upon one another. An actuator assembly supports several actuator arms. Each arm supports a magnetic head near the recording surface of its respective disc.

The magnetic head includes an inductive coil which reads and writes information by sensing or creating a changing magnetic field. For example, in write mode, the magnetic head writes information by forcing a relatively large current through the inductive coil in a selected direction to polarize a bit position adjacent the magnetic head in a selected direction. By controlling the direction at which the adjacent bit positions are polarized, digital information may be written onto the disc surface.

In read mode, the magnetic head senses changes in polarization of adjacent bit positions. The changes in polarization induce a current in the magnetic head in a direction indicative of the direction in which the adjacent bit positions are polarized. The direction of the induced current is, therefore, representative of the data stored on the disc.

During read mode, the read circuitry monitors the direction of current flow induced in the magnetic head at the head contacts. The read circuitry typically includes a read differential transistor pair connected between a read amplifier. Each transistor in the pair includes a control terminal connected to the head contacts. Differential voltages at the head contacts are indicative of the direction of induced current in the magnetic head. These differential voltages drive the transistors of the read differential transistor pair between on and off states. The read amplifier provides an output signal that corresponds to the on and off states of the read differential pair. Therefore, the output signal of the read amplifier is representative of the data stored on the disc surface.

A bias current is frequently provided to the read differential transistor pair to set an operating point for each of the transistors of the read differential transistor pair. A bias circuit provides the bias current to the control terminals of the read differential pair. Between the bias circuit and each of the control terminals are a pair of input resistors. These input resistors are selected to have a sufficiently high resistance value to provide a high input impedance at the differential transistor pair relative to the output impedance of the magnetic head. The relatively high input impedance at the differential transistor pair tends to reduce the attenuation of the magnetic head signal voltage at the input of the differential pair.

The resistance value of the input resistors is temperature dependent as is the gain or beta characteristics of the differential transistor pair. Therefore, the bias current as well as the voltage drop across the input resistors due to the bias current varies with temperature. As a result, the operating point of the differential pair varies with temperature. This operating point variation of the differential transistor pair may be tolerable at relatively high supply voltages e.g. greater than 4.5 volts. However, for operation at supply voltages that are less than 4.5 volts the operating point variation of the differential transistor pair is a serious problem. This operating point variation can cause saturation of transistors in either a current source or the read amplifier, each of which are frequently connected to the read differential transistor pair.

There is a present need for a read amplifier that is suited for interconnection with a magnetic head that is capable of operation with a low supply voltage.

SUMMARY OF THE INVENTION

The present invention is a voltage compensation device configured for connection to a differential transistor pair. The voltage compensation device includes a bias current sensing means that is configured for connection to a differential transistor pair. The bias current sensing means senses changes in bias current provided to a differential transistor pair. Included is a voltage compensation means that is configured for connection to a differential transistor pair for providing a compensation voltage that is inversely related to changes in bias current.

In one preferred embodiment, the present invention is a read amplifier that is configured for interconnection with a magnetic head through head contacts. The read amplifier includes a differential transistor pair connected between first and second supply terminals. The differential transistor pair has first and second control terminals that are connected to the magnetic head for providing voltage changes at output terminals related to voltage changes between the magnetic head contacts.

Included in the read amplifier is a first transistor that is connected between first and second supply terminal. The first transistor is configured for providing bias current to the differential transistor pair. Also included in the read amplifier is a bias current sensing means for sensing changes in bias current. A voltage compensation means is included for providing a compensation voltage that is inversely related to changes in bias current.

In this preferred embodiment, the voltage compensation means provides voltage compensation to the first and second control terminals to compensate for changes in bias current due to environmental factors.

In another preferred embodiment, the present invention is a bias generator that is configured for connection to a differential transistor pair. The bias generator includes a first transistor connected between first and second supply terminals. The first transistor is configured for providing bias current to a differential transistor pair. Included is a bias current sensing means for sensing changes in bias current. A voltage compensation means is also included for providing a compensation voltage that is inversely related to changes in bias current.

DETAILED DESCRIPTION OF THE PREFERRED EMBODIMENTS

Figure 1:
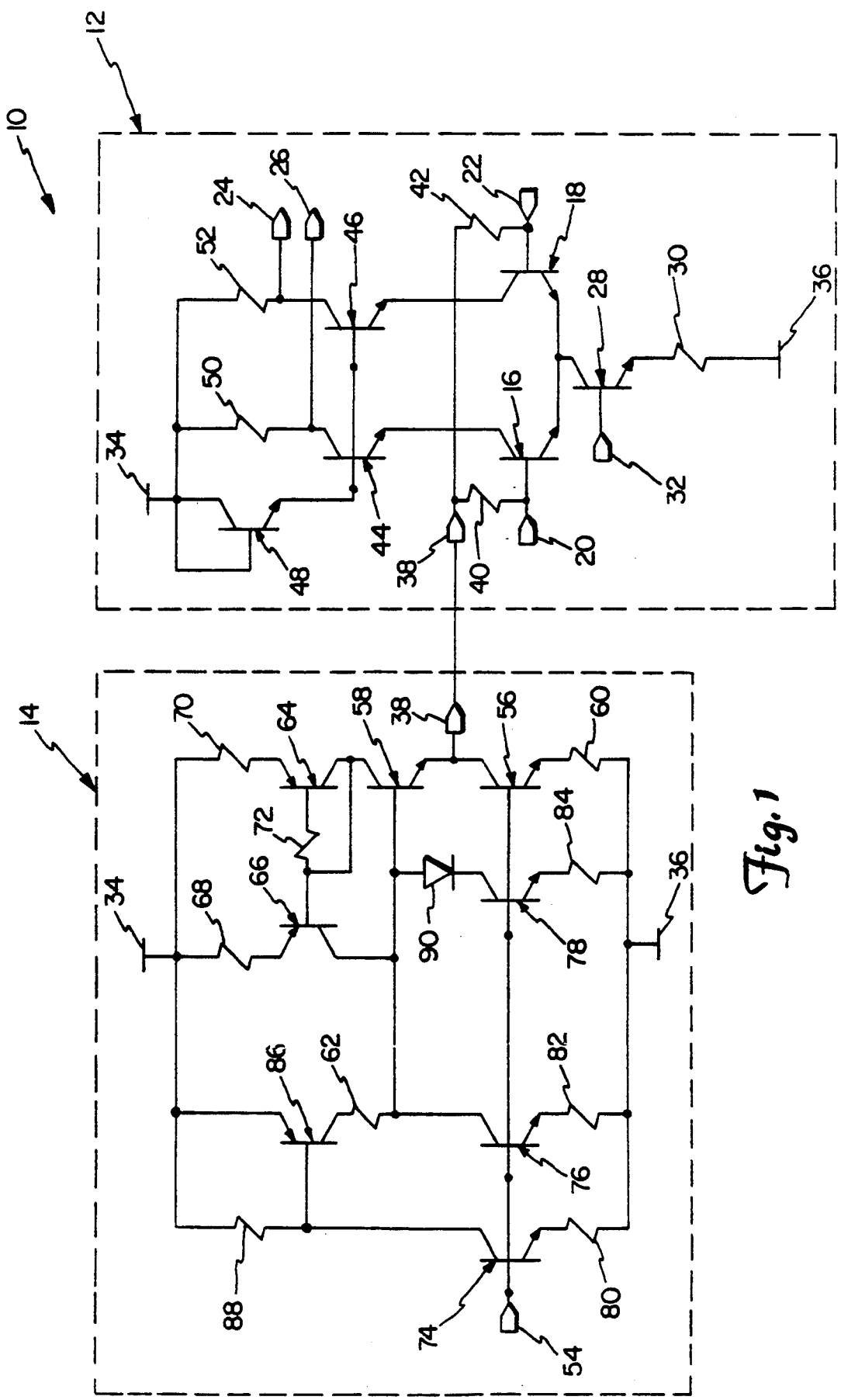
FIG. 1 is an electrical schematic diagram of a read amplifier and a bias generator of the present invention which are suited for operation with a low supply voltage.

FIG. 1 is a schematic diagram of a preferred embodiment of a read amplifier 10 of the present invention that is suited for low supply voltage operation. The read amplifier 10 includes an amplification portion 12 and a bias portion 14. The amplification portion 12 includes a read preamplifier that includes a differential transistor pair 16 and 18 that are suited for connection to a magnetic head (not shown). The bias portion 14 provides a bias voltage to each of the transistors 16 and 18 of the differential transistor pair. In addition, the bias portion 14 provides voltage compensation to the transistor 16 and 18 of the differential transistor pair. This voltage compensation tends to maintain a constant voltage due to a bias current at the bases of the differential pair 16 and 18 independent of temperature and process variations thereby allowing the amplification portion 12 to operate at low supply voltages.

The amplification portion 12 of the read amplifier 10 includes input terminals 20 and 22 that are suited for connection to the magnetic head which induces a current at these input terminals that is representative of the data stored on the disc. This induced current produces a corresponding voltage at the input terminals 20 and 22. The amplification portion 12 produces an output voltage at output terminals 24 and 26 that is representative of voltages that are induced at input terminals 20 and 22.

The amplification portion 12 further includes a preamplifier that includes a differential transistor pair 16 and 18, and a current source comprising transistor 28, resistor 30 and bias terminal 32. The preamplifier is connected between supply terminals 34 and 36 that are suited for connection to a voltage supply. The read preamplifier 10 is suited for operation with a supply voltage that is less than 4.5 volts and, in one preferred embodiment, the supply voltage is nominally 3.3 volts.

The read preamplifier includes the differential transistor pair 16 and 18 that are connected in a common emitter configuration with input terminals 20 and 22 connected to the bases of transistors 16 and 18, respectively. The current source includes transistor 28 connected in series with resistor 30 which are both connected between the emitters of transistors 16 and 18 of the differential pair and the supply terminal 36. The base of transistor 28 is connected to the bias terminal 32. The bias terminal 32 is suited for connection to a voltage source (not shown) that provides a collector current in transistor 28 that is proportional to absolute temperature. Voltage sources that provide collector current that is proportional to absolute temperature are known.

The differential transistor pair 16 and 18 are biased with a bias voltage that is provided to bias terminal 38 by bias portion 14. The bias terminal 38 is connected to the bases of the differential transistor pair 16 and 18 by input resistors 40 and 42, respectively. These input resistors 40 and 42 preferably have identical resistance values, and differential transistor pair 16 and 18 are preferably matched transistors so that when no input is present at the input terminals 20 and 22, the bias voltages at the bases of transistors 16 and 18 are substantially the same. In this manner, the operating points for each of transistors 16 and 18 are substantially the same.

The input impedance of the read preamplifier should be relatively large to prevent the attenuation of the voltage induced across the magnetic head. Because the output impedance of the magnetic head is relatively large, the input impedance of the read preamplifier must also be large to maximize the magnetic head voltage at the input terminals 20 and 22 of the read preamplifier. The input impedance of the read preamplifier is equal to the sum of the impedance of the series combination of resistors 40 and 42 in parallel with the sum of the impedances of the base emitter junctions of transistors 16 and 18. Therefore, to assure a relatively high input impedance for the read preamplifier, the resistance value for each of the input resistors 40 and 42 must be fairly large. In one preferred embodiment, input resistor 40 as well as input resistor 42 are equal to two kilo-ohms. In this same preferred embodiment, the impedance of the base emitter junction for each of transistors 16 and 18 is equal to 650 ohms. Therefore, for this preferred embodiment, the input impedance of the read preamplifier is approximately equal to 980 ohms.

The magnetic head is suspended over rotating magnetic storage media. As the magnetic storage media rotates, the magnetic head senses changes in polarization of adjacent bit positions. These changes in polarization induce a voltage across the magnetic head in a direction indicative of the direction at which adjacent bit positions are polarized. The direction of these induced voltages are therefore representative of the data stored on the disc. These induced voltages are provided to transistors 16 and 18 through input terminals 20 and 22, respectively. As these induced voltages change, the collector currents for each of the transistors 16 and 18 are modulated. The modulation of these collector currents produces a corresponding voltage change at output terminals 24 and 26. Therefore, the voltages at output terminals 24 and 26 are representative of data stored on the magnetic disc medium.

The amplification portion 12 further includes an impedance increasing section, such as a cascode section, that is made up of transistors 44, 46 and 48 and resistors 50 and 52 for increasing the input impedance of transistor 16 and 18. Transistor 44 and resistor 50 are connected in series between supply terminal 34 and the collector of transistor 16. Similarly, transistor 46 and resistor 52 are connected in series between the supply terminal 34 and the collector of transistor 18. The base and collector of transistor 48 is connected together thereby forming a diode that is connected between the supply terminal 34 and the bases of transistors 44 and 46. The transistor 48 provides a relatively constant bias voltage to the bases of transistor 44 and 46. The output terminal 24 is connected to the collector of transistor 46 and the output terminal 26 is connected to the collector of transistor 44.

As discussed previously, voltages induced by the magnetic head modulate the base to emitter voltages of transistors 16 and 18 which in turn modulate the collector current in each of these transistors. The modulation of the collector currents in transistors 16 and 18 produces a modulation of the voltage drop across resistors 50 and 52, respectively. Therefore, the voltages between each of the output terminals 24 and 26 and supply terminal 34 is modulated by the collector currents of transistors 16 and 18, respectively, which in turn is related to the data on the magnetic storage media.

A bias voltage provided at bias terminal 32 is selected to provide a collector current to transistor 28 that is relatively large for an improved signal to noise ratio. The noise effects are a result of the discrete nature of charge carriers frequently referred to as "shot noise." Both the shot noise and the transistor gain increase with increasing collector current, however, the transistor gain increase is faster than the shot noise increase. The bias voltage provided at bias terminal 38 is selected to provide emitter currents from each of transistors 16 and 18 that when combined are substantially equal to the collector current of transistor 28. In one preferred embodiment, the collector current for each of transistors 16 and 18 is four milliamps and the bias current that is provided to bias terminal 38 is 100 microamps.

Because resistors 40 and 42 are relatively large so that the input impedance of the read preamplifier is relatively large, and because the bias current provided to transistors 16 and 18 is relatively large for an improved signal to noise ratio, the voltage drop across each of the resistors 40 and 42, which is the product of the resistance and bias current, is also relatively large. In one preferred embodiment, the voltage drop across resistors 40 and 42 is 80 millivolts.

The bias current that is established by the bias voltage provided to transistors 16 and 18 of the read preamplifier is affected by a number of factors including variation in the resistance of resistors 40 and 42 and variation in the "beta" or ratio of collector current to base current for transistors 16 and 18. Both the value of resistors 40 and 42 and the beta of transistors 16 and 18 vary with both temperature and process variation in manufacture of the read amplifier 10. Therefore, the bias current established in transistors 16 and 18 of the read preamplifier varies with both temperature and process variation. Because the voltage drop across the input resistors 40 and 42 is fairly large, and because the voltage drop across these resistors is directly related to the bias current, the voltage drop variation across these resistors will also be large and vary with temperature. In one preferred embodiment, the voltage drop across each of resistors 40 and 42 varies in a range from 40 millivolts to 200 millivolts as a result of temperature and process variation.

The bias portion 14, or bias generator, of the present invention, in addition to providing a bias voltage at bias terminal 38 for biasing the read differential transistor pair 16 and 18, also provides voltage compensation to the bases of the differential transistor pair 16 and 18 to counteract voltage drop variation across resistors 40 and 42 due to bias current variation. The bias generator 14 of the present invention compensates the voltage at bias terminal 38 based on changes in the bias current provided by the bias generator 14 to prevent variations in bias current from changing the operating point of the differential transistor pair 16 and 18. In this manner, by forcing a compensation voltage at the bias terminal 38, the bias generator 14 of the present invention prevents either the differential transistor pair 16 and 18, or the transistors 44, 46 and 28 that are connected to the differential pair 16 and 18, from operating in saturation as a result of changes in the bias current to the differential transistor pair 16 and 18. Saturation of any of these transistors that are in the signal path between the input terminals 20 and 22 and the output terminals 24 and 26 results in loss of gain accuracy thereby resulting in distortion in the output signal at output terminals 24 and 26.

A transistor, when operated in a saturation condition, has gain distortion. Transistor 28 is operated in saturation if the bias voltage applied to transistors 16 and 18 is not large enough. If the bias voltage applied to the bases of transistors 16 and 18 is too large, transistors 16 and 18 become saturated and suffer from gain distortion. Therefore, the bias voltage at the bases of transistors 16 and 18 is selected so that neither transistors 16, 18 nor 28 are operated in saturation. The bias portion 14, which is the subject of the present invention, compensates this bias voltage to ensure transistors 16, 18 and 28 do not saturate as a result of variation such as temperature and process variation. The following is a more complete description of how changes in bias current result in saturation of either transistors 16 and 18 or transistor 28.

A decrease in the bias current established in transistors 16 and 18 decreases the voltage drop across resistors 40 and 42. This decrease in voltage drop across resistors 40 and 42 produces an increase in the voltage at the bases of transistors 16 and 18. This increase in base voltage of transistors 16 and 18 tends to increase the voltage at the emitters of transistors 16 and 18. This increase of the emitter voltages of transistors 16 and 18, if great enough, results in the reduction of the collector to emitter voltage causing the saturation of these transistors.

Conversely, an increase in the bias current established in transistors 16 and 18 increases the voltage drop across resistors 40 and 42. This increase in voltage drop across resistors 40 and 42 tends to decrease the voltage at the bases of transistors 16 and 18. This reduction of the base voltage for transistors 16 and 18 tends to reduce the voltage at the emitters of these transistors. The reduction of the emitter voltage of transistors 16 and 18 reduces the collector voltage of transistor 28, thereby reducing the collector to emitter voltages of transistor 28. The reduction of collector to emitter voltage, if great enough, results in the saturation of transistor 28.

For relatively large supply voltages such as those greater than 4.5 volts, headroom is relatively large and therefore greater D.C. voltage variations at the base of transistors 16 and 18 can be tolerated before saturation of either transistors 16 and 18 or transistor 28 occurs. However, at low supply voltages, such as those below 4.5 volts, there is less headroom and therefore a smaller amount of voltage swing at the bases of transistors 16 and 18 can be tolerated before saturation occurs. Therefore, the bias generator 14 of the present invention is necessary so that the voltage variation at the base of transistors 16 and 18 resulting from bias current variation is either limited or reduced for a low supply voltage operation.

In one preferred embodiment, the supply voltage provided between supply terminals 34 and 36 is nominally 3.3 volts and has a ten percent tolerance. For this embodiment, the worst-case minimum supply voltage is equal to the voltage drop across the base emitter junction of transistor 48 plus the voltage drop across the base emitter junction of transistor 44 plus the collector to emitter voltage of transistor 16 plus the collector to emitter voltage of transistor 28 plus the voltage drop across resistor 30. Under worst-case temperature conditions, the voltage drop across the base to emitter junctions of transistors 44 and 48 is equal to 0.9 volts, the collector to emitter voltages of transistors 16 and 28 are 0.5 volts, and the voltage drop across resistor 30 is 0.2 volts. Therefore, in this preferred embodiment, there is no headroom and sufficiently large variations in the operating point of transistors 16 and 18 such as the raising or lowering of the base voltages on these transistors due to changes in bias current will result in saturation of either transistors 16 and 18 or transistor 28. The bias generator 14 which is the subject of the present invention compensates the base voltage of transistors 16 and 18 for variations in bias current to prevent saturation from occurring thereby distorting the output signal at output terminals 24 and 26.

The bias generator 14, which is the subject of the present invention, includes a bias terminal 54 that is suited for connection to a current mirror and a bias terminal 38 that is suited for connection to the input resistors 40 and 42 of the read differential pair. In this manner, the bias terminal 38 provides a bias voltage to transistors 16 and 18. The bias generator 14 has supply terminals 34 and 36 that are suited for connection to a voltage supply. The bias generator 14 provides a selected bias voltage value to the differential transistor pair 16 and 18. This selected bias voltage establishes an initial bias current in transistors 16 and 18. The bias generator 14 provides a compensation voltage to bias terminal 38 that is representative of changes in bias voltage due to changes in bias current from the initial bias current value. The voltage compensation is equal to the voltage change at the bases of transistors 16 and 18 resulting from the change in bias current from the initial bias current value. In this manner, the bias generator 14 maintains a fixed voltage at the bases of the read differential transistor pair 16 and 18 independent of temperature and process variations.

The bias generator 14 includes a transistor 58 that is configured for providing a bias voltage having a bias current associated therewith to the differential transistor pair 16 and 18. The bias generator 14 further includes a voltage compensation means for providing a compensation voltage to the differential transistor pair 16 and 18 that is inversely related to changes in bias current. The voltage compensation means includes a resistor 62 which has a value that is substantially the same as each of resistors 40 and 42. In addition, the bias generator 14 further includes an error amplifier means for providing a current through resistor 62 that is substantially equal to the inverse of the change in bias current from a selected value through each of resistors 40 and 42. The voltage at the base of transistors 16 and 18 is based on the sum of the voltage drops across resistor 62 and the input resistors 40 and 42, respectively. Changes in current through resistor 62 produce voltage changes which compensate the base voltage of transistors 16 and 18 for voltage changes across resistors 40 and 42 due to changes in bias current.

For example, assuming that each of resistors 40, 42 and 62 have a resistance of 2 kilo-ohms, then a decrease in bias current by ten microamps increases the voltage at each of the bases of transistors 16 and 18 by ten millivolts. The bias current divides equally among resistors 40 and 42, therefore the decrease in current through each of resistors 40 and 42 is half the combined decrease in bias current or 5 microamps. The current through resistor 62 is correspondingly increased by 5 microamps thereby decreasing the voltage at each of the bases of transistors 16 and 18 by 10 millivolts.

Conversely, an increase in bias current by 10 microamps decreases the voltage at each of the bases of transistors 16 and 18 by 10 millivolts. The current through resistor 62 is correspondingly decreased by 5 microamps thereby increasing the voltage at each of the bases of transistors 16 and 18. In this manner, voltage changes at the bases of transistors 16 and 18 due to changes in bias current are compensated, thereby maintaining a constant voltage at the bases of transistors 16 and 18 independent of changes in bias current.

In one preferred embodiment, the error amplifier means for providing a current through resistor 62 that is substantially equal to the inverse of the change in bias current from a selected value through each of resistors 40 and 42 comprises a first current source that includes a transistor 56 and a resistor 60, a current mirror that includes transistors 64 and 66, and resistors 68, 70 and 72. The bias generator 14 also includes second, third and fourth current sources comprising transistors 74, 76, 78 and resistors 80, 82, and 84, respectively. In one preferred embodiment, each of the first, second, third and fourth current sources are connected to bias terminal 54, which provides a bias voltage to establish each of these current sources. In one preferred embodiment, the bias voltage at bias terminal 54 is established by a transistor (not shown) connected between a current source and terminal 36, with the base of the transistor connected to bias terminal 54 as well as the collector of the transistor. The emitter of this transistor is connected to a resistor (not shown) that has a resistance value that is matched with resistors 80, 82, 84 and 60 that is connected to terminal 36. Therefore, the voltage at bias terminal 54 is equal to the sum of a forward biased diode voltage and the voltage drop across the emitter resistor.

In one preferred embodiment, transistor 58 of bias generator 14 is configured as a cascode device to pass current at an emitter to a collector thereby providing a low impedance voltage source at terminal 38. Transistor 58 is connected between the current mirror and the first current source, with the emitter of transistor 58 connected to the collector of transistor 56. The first current source establishes a collector current in transistor 58. An emitter current provided by transistor 58 is equal to the sum of the collector current of this transistor and bias current established in the differential transistor pair 16 and 18. A bias voltage at bias terminal 38 is set by transistor 86 and resistor 62, as will be discussed later.

The previously discussed current mirror mirrors the collector current of transistor 58 to provide a current at the collector of transistor 66 that is related to the current in the collector of transistor 58. In one preferred embodiment, the collector current of transistor 66 is one-half as large as the collector current in transistor 58. In this preferred embodiment, this scaling of collector current in transistor 66 with the collector current in transistor 58 is accomplished by making the resistance of resistor 68 approximately twice as large as the resistance of resistor 70. In addition to using scaling resistors 68 and 70, the emitter areas of transistors 64 and 66 are also scaled with the emitter area of transistor 64 being approximately twice as large as the emitter area of transistor 66.

As discussed previously, transistor 86 provides a bias current to the base of transistor 58. Transistor 86 is biased by transistor 74 and resistor 88. Transistor 74 is biased so that current passes between the collector and emitter by a bias current provided at bias terminal 54. In one preferred embodiment, the bias terminal 54 is connected to a constant current source that has a temperature coefficient and therefore provides a current that has minor variations with temperature. Current conducted by transistor 74 produces a voltage drop across resistor 88 that forward biases the emitter base junction of transistor 86 so that transistor 86 is operated in the saturation region thereby forcing the collector voltage toward the voltage of the supply terminal 34. Transistor 76 provides a third current source for producing a voltage drop across resistor 62. The base of transistor 76 is connected to the bias terminal 54 that supplies a bias voltage that forward biases the base emitter junction so that transistor 76 conducts current between the collector and emitter.

The fourth current source consists of diode 90, transistor 78 and resistor 84, each of which are connected in series between the base of transistor 58 and the supply terminal 36. The base of transistor 78 is connected to bias terminal 54. Current provided by the bias terminal 54 biases the base emitter junction of transistor 78 so that current flows between the collector and emitter of transistor 78. The fourth current source together with the first and third current sources and the current mirror form an error amplifier, as will be discussed later, for varying current in resistor 62 based on changes in bias current.

The diode 90 has a cathode connected to the collector of transistor 78 and an anode connected to the base of transistor 58. Diode 90 forces the collector to emitter voltage of transistor 78 to be the same as the collector to emitter voltage of transistor 56 thus canceling the Early effects.

In one preferred embodiment, resistor 84 is twice as large as resistor 60 and the emitter area of transistor 56 is twice as large as the emitter area of transistor 78. For this preferred embodiment, the ratio of collector current in transistor 78 to the collector current in transistor 56 is one-half. Therefore, there is half as much current passing between the collector and emitter of transistor 78 as passing between the collector and emitter of transistor 56.

As previously discussed, the bias generator 14 varies the voltage at the bias terminal 38 in response to changes in bias current provided by transistor 58 to the differential transistor pair 16 and 18 so that the voltage at the bases of the differential transistor pair 16 and 18 remains constant. The following provides greater detail of the interrelationship between bias current and the voltage compensation at bias terminal 38. A Kirchoff's voltage law equation can be written for the voltage at bias terminal 38 as shown by the following equation:

$$V_{38} = V_{SUPPLY} - V_{CE(86)(SAT)} - (I_{62}R_{62}) - V_{BE(58)} \quad (1)$$

where $V_{38}$ represents the voltage at bias terminal 38 relative to supply terminal 36, $V_{SUPPLY}$ represents the supply voltage or the voltage between supply terminals 34 and 36, $V_{CE(86)(SAT)}$ represents the collector to emitter voltage of transistor 86 operating in saturation mode, $I_{62}$ represents a current passing between the terminals of resistor 62, $R_{62}$ represents the resistance of resistor 62, and $V_{BE(58)}$ represents the base emitter voltage of transistor 58.

The current in resistor 62 can be expressed by writing a Kirchoff's current law equation represented by the following equation:

$$I_{62} = I_{C(76)} + I_{C(78)} - |I_{C(66)}| \quad (2)$$

where $I_{C(76)}$ represents the collector current of transistor 76, $I_{C(78)}$ represents the collector current of transistor 78 and $|I_{C(66)}|$ represents the magnitude of the collector current of transistor 66. In Equation 2, it is assumed that the base current of transistor 58 is negligible relative to the collector currents of transistors 66, 76 and 78 and therefore can be ignored.

Assuming that transistors 16 and 18 are ideal and have an infinite beta then the bias generator 14 provides an initial bias voltage to bias terminal 38 thereby establishing a bias voltage at the bases of transistors 16 and 18. For this ideal condition, the bias generator does not provide any voltage compensation to the bias terminal 38. For this initial condition, the collector current of transistor 78 of the fourth current source is equal to the collector current of transistor 66 and the collector current of transistor 86 is equal to the collector current of transistor 76 of the third current source. The emitter current of transistor 58 is substantially equal to the collector current of transistor 56 of the first current source.

As previously discussed, the bias current provided to transistors 16 and 18 may vary from this ideal value as a result of, for example finite beta, temperature or process changes. This change in bias current from the ideal bias current value produces a change in the bias voltage at the bases of transistors 16 and 18, voltage compensation is provided by the present invention to bias terminal 38 for preventing the operating point of transistors 16 and 18 from changing. If the bias current drawn by transistors 16 and 18 increases from the ideal values, then the collector current in both transistors 58 and 64 will increase by the sum of the base current provided to transistor 16 and transistor 18 as represented by the following:

$$I_{C(58)} = I_{C(64)} = I_{B(16)} + I_{B(18)} + I_{C(56)} \quad (3)$$

where $I_{B(16)}$ represents the base current of transistor 16, $I_{B(18)}$ represents the base current of transistor 18, and $I_{C(56)}$ represents the collector current in transistor 56. The collector current of transistor 66 as a result of the mirror ratio is half of the collector current of transistor 64 as represented by the following equation:

$$I_{C(66)} = \tfrac{1}{2} I_{C(64)} \quad (4)$$

Substituting the expression for the collector current of transistor 64 in terms of the base currents of transistors 16 and 18 from Equation 3 yields the following expression for the collector current of transistor 66:

$$I_{C(66)} = \tfrac{1}{2}(I_{B(16)} + I_{B(18)} + I_{C(56)}) \quad (5)$$

Because the ratio of collector current in transistor 78 is equal to one half the collector current in transistor 56 we can write the following:

$$I_{C(78)} = \frac{I_{C(56)}}{2} \quad (6)$$

For small signal inputs to the differential transistor pair 16 and 18, $I_{B(16)}$ is equal to $I_{B(18)}$. Therefore both $I_{B(16)}$ and $I_{B(18)}$ can be represented by $I_B$. Substituting $I_B$ into equation 5 we can write the following:

$$|I_{C(66)}| = \frac{I_{C(56)}}{2} + I_B \quad (7)$$

Substituting the relationship in equation 6 into equation 7 yields the following:

$$|I_{C(66)}| = I_{C(78)} + I_B \quad (8)$$

Substituting the expression for $I_{C(66)}$ of equation 8 into 2 and simplifying yield the following:

$$I_{62} = I_{C(76)} - I_B \quad (9)$$

The base voltages of transistors 16 and 18 which we desire to be insensitive to bias currents are equal to the voltage at bias terminal 38 minus the voltage drop across resistors 40 and 42. Because $I_{B(16)}$ is equal to $I_{B(18)}$ and resistor 40 is equal to resistor 42 then the voltage at the input terminal 20 is equal to the voltage at the input terminal 22. Therefore, the voltage at the bias terminal 38 can be represented by the following:

$$V_{(20,22)} = V_{38} - I_B R_{(40,42)} \quad (10)$$

where $R_{(40,42)}$ is equal to the resistance of resistor 40 and resistor 42, and where $V_{(20,22)}$ is equal to the D.C. voltage at each of input terminals 20 and 22.

Substituting $I_{C(76)} - I_B$ of equation 9 for $I_{62}$ of equation 1 and substituting the expression for $V_{38}$ of equation 1 into equation 10 with $R_{62}$ set equal to $R_{(40,42)}$ so that the bias current dependent terms cancel thereby yielding the following:

$$V_{(20,22)} = V_{SUPPLY} - V_{CE(86)(sat)} - I_{C(76)}(R_{62}) - V_{BE(58)} \quad (11)$$

The voltage at the collector of transistor 16 is equal to $V_{SUPPLY} - V_{BE(48)} - V_{BE(44)}$ and the voltage at the emitter of transistor 16 is equal to $V_{(20,22)} - V_{BE(16)}$ therefore the collector to emitter voltage of transistor 16 is equal to the following, assuming all emitter base voltages are equal, the following equation can be written:

$$V_{CE(16)} = V_{CE(86)(SAT)} + I_{C(76)} R_{62} \quad (12)$$

where $V_{CE16}$ is equal to the collector to emitter voltage of transistor 16. As can be seen in equation 13 the bias current dependent terms have cancelled and for this reason the bias generator of the present invention can prevent saturation over a wide range of temperature and process variations.

Transistor 18 is connected in a manner similar to Transistor 16 and therefore will have a similar collector to emitter voltage bias current independence as described with respect to transistor 16.

In one preferred embodiment, the magnetic storage system includes a plurality of magnetic storage discs and a plurality of magnetic heads supported near recording surfaces for each of the plurality of magnetic storage discs. Associated with each magnetic head is a differential transistor pair 16, 18, input resistors 40, 42, transistors 44, 46, 48, resistors 50, 52, output terminals 24, 26, input terminals 20, 22, and bias portion 14. The emitters of each read differential transistor pair 16 and 18 for each of the plurality of magnetic heads are connected to the collector of a single current source. This single current source includes transistor 28, resistor 30 and bias terminal 32.

Only a single magnetic head is read from at a given time. The magnetic head that is read from is selected by applying a bias voltage to bias terminal 54 for the bias portion 14 associated with the selected magnetic head.

The bias signal is removed from bias terminal 54 for the bias portions 14 associated with unselected magnetic heads. The removal of the relatively constant current bias voltage from bias terminal 54 of the unselected magnetic heads causes the voltage at bias terminal 38 to collapse to or nearly to the voltage at supply terminal 36 thereby allowing little power to be consumed in the unselected state. The collapse of the bias voltage at bias terminal 38 is accomplished by resistor 88 which pulls transistor 86 out of saturation by pulling the base to near the supply terminal 34 if the bias voltage is no longer present at bias terminal 54. If a bias voltage is then provided at the bias terminal 54 of the bias portion 14 associated with the selected magnetic head, transistor 86 saturates and resistor 62 pulls the base of transistor 58 toward the supply voltage 34 thereby turning on transistor 58 and raising the voltage to a selected bias voltage at bias terminal 38.

In operation, a temperature-compensated current source is provided to bias terminal 54 for the bias portion 14 that is associated with the selected magnetic head. A current source that is proportional to absolute temperature is provided to bias terminal 32. The selected magnetic head encounters polarized bit positions that induce currents in the bases of the read differential pair 16 and 18. These induced currents modulate the collector currents in these transistors thereby modulating the voltages at output terminals 24 and 26.

A compensated bias voltage is provided to bias terminal 38 from bias portion 14. Changes in bias current provided to bias terminal 38 are compensated for by changes in the voltage at bias terminal 38 thereby maintaining a substantially constant bias voltage at the bases of the differential transistor pair 16 and 18.

Although the present invention has been described with reference to preferred embodiments, workers skilled in the art will recognize that changes may be made in form and detail without departing from the spirit and scope of the invention.

What is claimed is:

1. A voltage compensation device for a differential read amplifier including a differential transistor pair having first and second impedances connected thereto, and a bias current that produces a corresponding bias voltage in the differential transistor pair, the voltage compensating device comprising:

bias current sensing means for sensing changes in bias current; and voltage compensation means responsive to the bias current sensing means for maintaining a constant bias voltage at the differential transistor pair that is independent of changes in bias current.

2. The voltage compensation device of claim 1 further including a first transistor connected between first and second supply terminals, the first transistor configured for providing bias voltage to the differential transistor pair.

3. The voltage compensation device of claim 2 further including first and second impedances connected between the first transistor and the differential transistor pair.

4. A read amplifier configured for connection to a magnetic head, the read amplifier comprising:

a differential transistor pair connected between first and second supply terminals and having first and second control terminals connected to a magnetic head for providing voltage changes at output terminals related to voltage changes across the magnetic head;

a first transistor connected between first and second supply terminals, the first transistor configured for providing bias current to the differential transistor pair;

bias current sensing means for sensing changes in bias current; and voltage compensation means for providing voltage compensation for maintaining the differential transistor pair operating point constant independent of bias current.

5. The read amplifier of claim 4 further including first and second impedances connected between the first transistor and the differential transistor pair.

6. A bias generator for connection to a differential transistor pair of a read amplifier, the bias generator comprising:

a first transistor connected between first and second supply terminals, the first transistor configured for providing a bias voltage having a bias current associated therewith to a differential transistor pair; and voltage compensation means for providing a compensation voltage to the differential transistor pair, the compensation voltage together with the bias voltage provide a compensated bias voltage that is constant and independent of changes in bias current.

7. The bias generator of claim 6 wherein the compensation voltage compensates for changes in bias current due to environmental factors.

8. The bias generator of claim 6 further including first and second impedances connected to the first transistor with the first and second impedances configured for connection to a differential transistor pair.

9. The bias generator of claim 8 further including a differential transistor pair connected to the first and second impedances with the differential transistor pair configured for connection to a magnetic head.

10. The bias generator of claim 6 further including a base current sensing means for sensing changes in the bias current.

11. A read amplifier configured for interconnection with a magnetic head through head contacts, the read amplifier comprising:

a differential transistor pair connected between first and second supply terminals and having first and second control terminals connected to the magnetic head for providing voltage changes at output terminals related to voltage changes between the magnetic head contacts;

first and second impedances connected to the first and second control terminals of the differential transistor pair;

bias current means connected to each of the first and second supply terminal for providing bias current for establishing a corresponding bias voltage in the differential transistor pair; and voltage compensation means for providing voltage compensation to the first and second control terminals to maintain a constant bias voltage independent of changes in bias current.

12. The read amplifier of claim 11 wherein the voltage compensation means provides a compensation voltage that has a magnitude that is substantially equal to a change in voltage drop across at least one of the first and second impedances due to a change in bias current.

13. The read amplifier of claim 11 wherein the voltage compensation means provides a compensation voltage to each of the first and second impedances.

14. The read amplifier of claim 11 wherein the voltage compensation means provides voltage compensation to the first and second control terminals based on changes in bias current.

15. The read amplifier of claim 11 wherein bias current provided to the differential transistor pair produces a bias voltage at the first and second control terminals and wherein the voltage compensation means provides a compensation voltage to the first and second control terminals for maintaining a bias voltage that is constant independent of changes in bias current.

16. The read amplifier of claim 11 and further including:

a current sink transistor connected between the differential transistor pair and the second supply terminal;

a first collector transistor connected between the first supply terminal and a first transistor of the differential transistor pair; and a second collector transistor connected between the first supply terminal and the collector of a second transistor of the differential transistor pair.

17. The read amplifier of claim 11 wherein the voltage compensation means provides voltage compensation to the first and second control terminals to compensate for changes in bias current due to environmental factors.

18. A bias generator for providing bias current to a differential read amplifier, the bias generator comprising:

a first input impedance configured for connection to a differential read amplifier; first and second supply terminals;

a first transistor connected between first and second supply terminals with the emitter of the first transistor connected to the first input impedance;

mirror means connected between the first supply terminal and the collector of the first transistor for providing a mirror current to the base of the first transistor that is related to the first input impedance current by a selected ratio;

a voltage compensation impedance connected between the first supply terminal and the base of the first transistor;

first biasing means connected between the emitter of the first transistor and the second supply terminal for providing a bias current for the first transistor; and second biasing means connected between the voltage compensation impedance and the second supply terminal for providing bias current to the base of the first transistor so that voltage changes across the first input impedance are compensated for by voltage changes across the voltage compensation impedance so that a bias voltage associated with the bias current is constant independent of changes in the bias current.

19. The bias generator of claim 18 wherein the mirror means provides changes in the voltage compensation impedance current that are related to changes in the first input impedance current by the selected ratio of the mirror means.

20. The bias generator of claim 18 wherein the mirror means provides changes in the voltage compensation impedance current that are inversely related to changes in the first input impedance current.

21. The bias generator of claim 18 wherein both the first input impedance and the voltage compensation impedance have impedance values that are substantially the same.

22. The bias generator of claim 18 wherein the mirror means provides changes in the voltage compensation impedance current which produces corresponding voltage changes across the first voltage compensation impedance with voltage changes across the first voltage compensation impedance having a magnitude that is substantially the same as a magnitude of voltage changes across the first input impedance due to changes in current through the first input impedance.

23. The bias generator of claim 18 and further including a second input impedance connected to the emitter of the first transistor and with voltage changes from a selected value across each of the first and second input impedances producing voltage changes having magnitudes substantially the same and polarities that are opposite.

24. The bias generator of claim 18 wherein the second bias means includes:
   a second transistor connected between the first supply terminal and the voltage compensation impedance; and
   third biasing means providing bias current for the second transistor in response to a bias input signal.

25. The bias generator of claim 24 wherein the third biasing means includes:
   a third transistor connected between the base of the first transistor and second supply terminal; and
   a fourth transistor connected between the base of the second transistor and the second supply terminal with the base of each of the third and four transistors suited for connection to the bias input signal.

26. A bias generator for providing bias current to a differential transistor pair of a read amplifier, the bias generator comprising:
   first and second supply terminals suited for connection to an electromotive force;
   a first transistor connected between the first and second supply terminals, the first transistor configured for connection to a differential transistor pair;
   mirror means connected between the first supply terminal and the first transistor for providing a current related to a first transistor current;
   a voltage compensation impedance connected between the first supply terminal and the first transistor;
   biasing means connected between the first transistor and the second supply terminal for providing bias current for the first transistor; and
   current source means connected between the base of the first transistor and the second supply terminal for providing current therebetween so that changes in current provided by the first transistor produce an inverse change in current for the voltage compensation impedance thereby maintaining a constant bias voltage independent of changes in bias current at the differential transistor pair.

* * * * *